United States Patent [19]

Suppelsa et al.

[11] Patent Number: 4,992,139
[45] Date of Patent: Feb. 12, 1991

[54] CONDUCTIVE MASK AND METHOD OF MAKING SAME

[75] Inventors: Anthony B. Suppelsa, Coral Springs; Robert W. Pennisi, Boca Raton; James L. Davis, Tamarac; Robert J. Mulligan, Plantation, all of Fla.

[73] Assignee: Motorola, Inc., Schaumburg, Ill.

[21] Appl. No.: 437,136

[22] Filed: Nov. 16, 1989

[51] Int. Cl.$^5$ .......................... C23F 1/02; B44C 1/22; C03C 15/00; C03C 25/06
[52] U.S. Cl. .................................... 156/656; 29/852; 29/846; 156/659.1; 156/666; 156/902; 427/97; 428/139; 428/209; 428/901
[58] Field of Search ...................... 156/656, 659.1, 666, 156/901, 902; 427/96, 97; 29/846, 852; 174/68.5; 428/131, 137, 138, 139, 140, 209, 901

[56] References Cited

U.S. PATENT DOCUMENTS

| | | | |
|---|---|---|---|
| 3,287,191 | 11/1966 | Borth | 156/666 X |
| 4,293,377 | 10/1981 | Miyajima | 156/659.1 X |
| 4,323,593 | 4/1982 | Tsunashima | 29/852 X |
| 4,755,551 | 7/1988 | Nakano et al. | 427/97 X |
| 4,814,040 | 3/1989 | Ozawa | 156/634 |
| 4,827,326 | 5/1989 | Altman et al. | 357/67 |

OTHER PUBLICATIONS

Printed Circuit Design Handbook, Manufacture, Components & Assembly, 1982, 1981 by Electrochemical Publications Ltd., (pp. 198–204).
Printed Circuit Handbook © 1979, Chapter 6, 1967 by McGraw Hill, Inc. by Ernest Armstrong and Edward F. Duffek.
Flexible Circuits © 1984 by Marcel Dekker, Inc., Steve Gurley.

Primary Examiner—William A. Powell
Attorney, Agent, or Firm—Pablo Meles; Daniel K. Nichols

[57] ABSTRACT

A first conductive layer 12 is deposited on the substrate 14. Next, a second conductive layer 16 with a circuit pattern is deposited on the first layer 12. Finally, the first conductive layer 12 not residing under the second conductive layer 16 is etched off, leaving the second layer 16 above the first layer 12.

9 Claims, 2 Drawing Sheets

CONDUCTIVE MASK AND METHOD OF MAKING SAME

TECHNICAL FIELD

This invention relates generally to methods of producing conductive patterns on a substrate, and more specifically to a method of producing conductive patterns on a substrate using a conductive mask.

BACKGROUND

Methods of manufacting flex circuit are well known in the art. Typically, copper metalized films of polyester or polyimide on a substrate are screen printed with an etch resist over the copper film. Then the unmasked copper is etched away, and the etch resist is subsequently stripped. A protective layer is then added, exposing only areas that will be interconnected to other components or contacts.

Copper films used in the method described above, typically being 0.7 to 3.0 mils thick, require considerable amounts of etch chemicals and manufacturing time. Furthermore, the etch resist requires stripping, thereby adding additional chemistry and manufacturing time.

Sputter metallization coated polyester or polyimides are inexpensive, but are metalized too thinly (1000Å to 1-micron) to provide the adequate flexible mechanical integrity needed for useful flex circuits. Additional plating would be required in order to effect any flexible mechanical integrity in a flex circuit. Despits its poor mechanical attributes, sputter metallization typically has low sheet resistances. For instance, Sputter deposited copper, depending on thickness, has a typical sheet reistance 0.1 to 5 milliohms per square.

Polymer thick film (PTF) systems, on the other hand, adequately and inexpensively provide mechanical integrity in flex circuits, but unfortunately have a high resistance. For instance, PTF has sheet resistances of 30 to 200 ohms per square, but is able to withstand millions of impacts and flexes without degradation. Reducing the resistance can be effected by loading the PTF with silver, but the cost benefits are defeated. Accordingly, a need exists for a low cost method of producing conductive patterns on a substrate utilizing the best attributes of the PTF system and the sputter metallization process, namely a low cost method of producing conductive patterns having low resistance and ruggedness to withstand many impacts and flexes.

SUMMARY OF THE INVENTION

Accordingly, it is an object of the present invention to provide a method of producing a conductive path on a substrate.

Briefly, according to the invention, a first conductive layer is deposited on the substrate. Next, a second conductive layer with a circuit pattern is deposited on the first layer. Finally, the first conductive layer not residing under the second conductive layer is etched off, leaving the second layer above the first layer.

In an alternative embodiment of the present invention, through holes can be punched through the first conductive layer. then the second conductive layer can be deposited on the first conductive layer and through the through holes if desired. As bnefore, the first conductive layer not residing under the second conductive layer is etched off, leaving the second layer above the first layer.

DETAILED DESCRIPTIOIN OF THE PREFERRED EMBODIMENT

Figure 1:
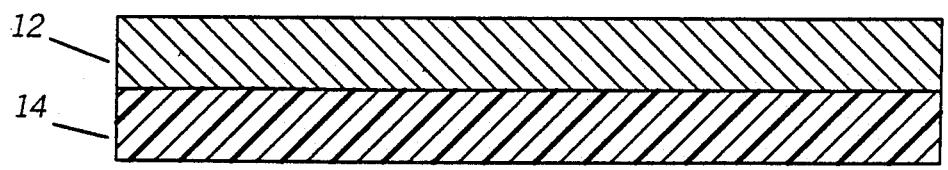
FIG. 1 is a sectional view of a substrate with a layer of metallization.

Referring to FIG. 1, there is shown a substrate 14 with a conductive, preferably metallic surface 12 attached to the substrate 14. In the preferred embodiment, the substrate comprises flexible film such as KAPTON ® or polyester film such MYLAR ®(both made by DuPont) and the metallic surface is copper, preferably copper sputtered (or similarly vacuum deposited) onto metalized polyester or polyimide film.

Figure 2:
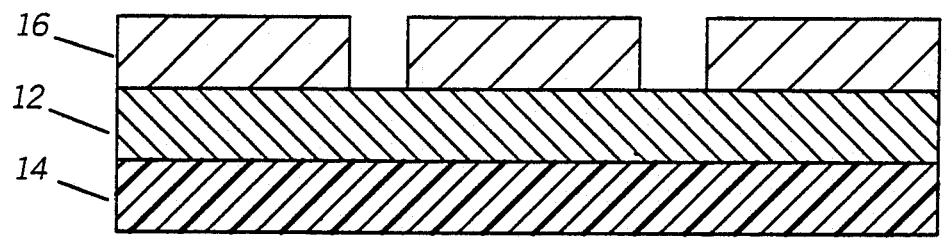
FIG. 2 is a sectional view of FIG. 1 with an additional layer of conductive masking material.

Referring to FIG. 2, a conductive mask, desirably a layer of Polymer Thick Film (PTF) 16, such as graphite paint or carbon ink is screened on the metallic surface 12 to provide a predetermined pattern where circuit runners are desired. Optionally, through holes (not shown) can be punched through the metallic surface 12. Then the layer of PTF (16) can be deposited on the metallic surface 12 and through the through holes if desired. As before, the metallic surface 12 not residing under the PTF 16 is etched off, leaving the PTF above the metallic surface.

Figure 3:
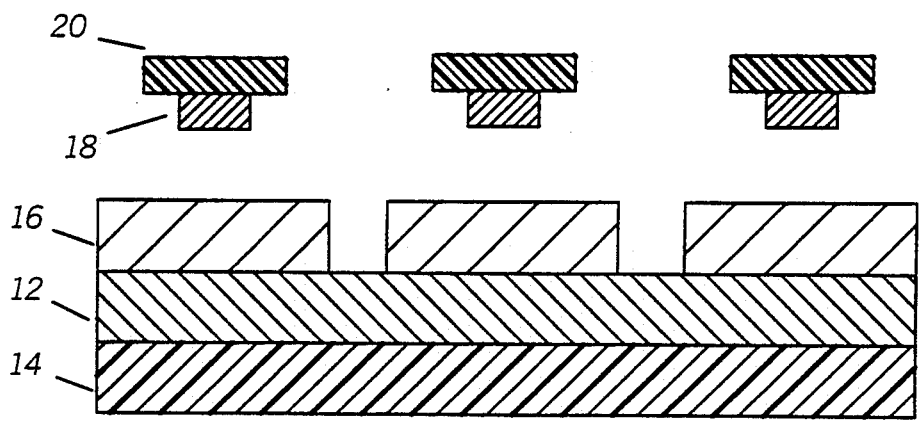
FIG. 3 is a sectional view of FIG. 2 is accordance with the present invention.
Figure 4A:
FIG. 4 shows sectional views of an alternative embodiment of tge present invention where a through hole is used.
Figure 4B:
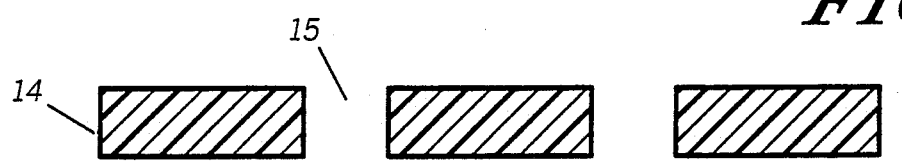
Figure 4C:
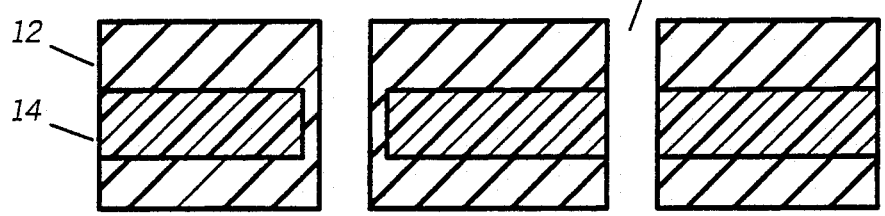
Figure 4D:
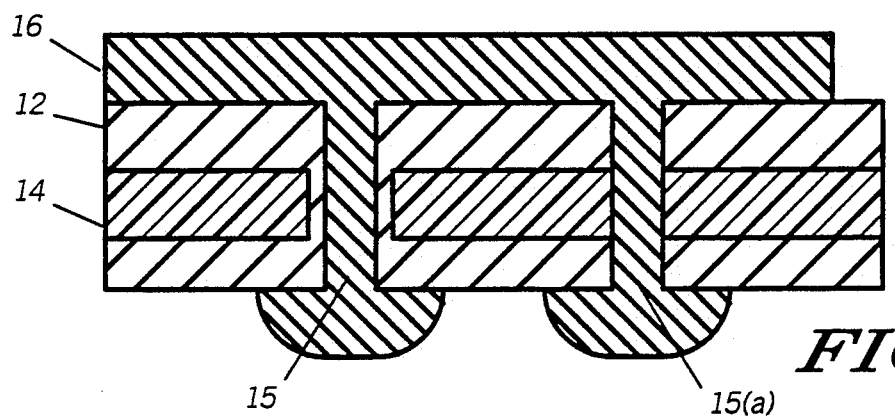
Figure 4E:
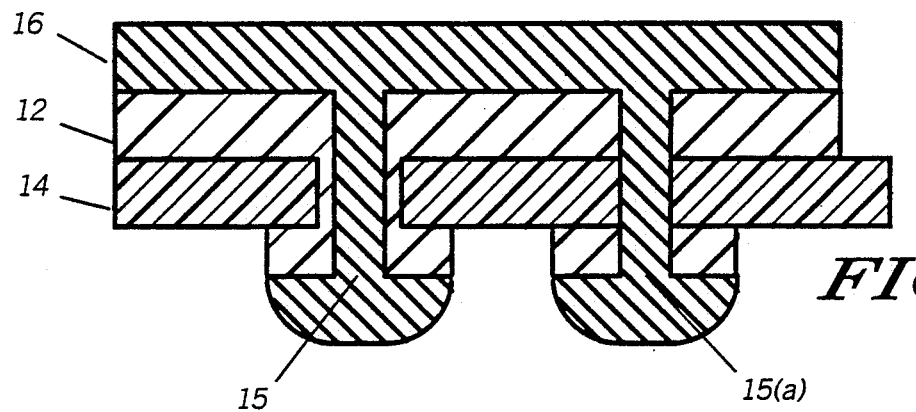

Referring to FIG. 3, once the PTF is cured or otherwise ready, the uncoated, unwanted metallic surfaces can be removed, preferably by etching using commercially available copper chloride etchants or by using peroxide and sufuric acid etchants. The later of PTF 16 remains even after the unmasked or uncovered metallic surface 12 is etched. There is no need to strip the PTF layer as in typical masking of circuit boards since the mask itself is conductive. For instance, a component would not require direct contact with the metallic surface 12, but can couple through the PTF layer 16 in order to electronically interconnect with other conductive runner or components. Moreoverm the parallel combination of PTF over copper metallization results in an apparent electrical sheet resisitivity less than that of sputtered copper alone, with the resultant ruggedness of PTF.

The present invention could be aptly used in conjunction with elastomeric keypads 20 and their respective contacts 18 where the PTF layer 16 will likely encounter many impacts, stresses, and strains. Interconnection between components can be done via highly conductive metal filled polymer thick film such as metal filled conductive epoxies. Interconnection between components preferably can be done with the metallic surface 12 instead of with the PTF layer or alternatively in combination with the PTF layer, but only so that the electricity travels the least path of resistance.

Referring to FIG. 4, the process of making an alternative embodiment of the present invention is shown. In step 1, substrate 14 is provided. In step 2, a through hole (15) is punched through the substrate. In step 3, a metallic surface 12, such as copper, is deposited on the substrate and through the through hole 15. Alternatively, the through hole 15a can be punched through the substrate 14 and the metallic surface 12. In step 4, the PTF (16) layer is deposited on the metallic surface 12 and through the through hole 15. In step 5, the metallic surface 12 not under the PTF (16) layer is etched away.

What is claimed is:

1. A method of producing a conductive path on a substrate having a top and a bottom surface, comprising the steps of:
   (a) depositing a first conductive layer on the top and the bottom surfaces of the substrate;
   (b) punching at least one through hole through the first conductive layer and said substrate;
   (b) depositing a second conductive layer with a predetermined pattern on the first conductive layer and through some of the through holes;
   (c) etching the first conductive layer not residing under the second conductive layer, wherein the second conductive layer remains above the first conductive layer.

2. A method of producing a conductive path on a substrate comprising the steps of:
   (a) depositing a first conductive layer on said substrate;
   (b) depositing a second conductive layer with a predetermined pattern on the first conductive layer;
   (c) etching the first conductive layer not residing under the second conductive layer, wherein the second layer remains above the first layer; and
   (d) providing a conductive path through the first and the second conductive layers for interconnecting with an electronic component.

3. The method of claim 2, wherein the first conductive layer comprises copper.

4. The method of claim 2, wherein the second conductive layer comprises an electrically conductive polymer thick film.

5. The method of claim 2, wherein the second conductive layer comprises graphite paint.

6. A conductive path on a substrate produced in accordance with the method of claim 2.

7. A conductive path on a substrate, comprising:
   a metallization layer on said substrate;
   a pattern of polymer thick film on the metallization layer;
   means, retaining the path of polymer thick film, for removing portions of the metallization layer not under the pattern of polymer thick film;
   means for providing a conductive path through the metallization and the pattern of polymer thick film for interconnecting with at least one electronic component.

8. The conductive path of claim 7, wherein the polymer thick film comprises conductive graphite paint.

9. A method of producing a conductive path on a substrate, comprising the steps of:
   (a) depositing a first conductive layer on said substrate;
   (b) punching at least one through hole through the first conductive layer and said substrate;
   (b) depositing a second conductive layer with a predetermined pattern on the first conductive layer and through some of the through holes;
   (c) etching the first conductive layer not residing under the second conductive layer, wherein portions of the second layer remains above the first layer and other portions of the second layer remains above said substrate.

* * * * *